(12) United States Patent
Brown et al.

(10) Patent No.: US 6,797,592 B2
(45) Date of Patent: Sep. 28, 2004

(54) METHOD FOR FORMING A RETROGRADE IMPLANT

(75) Inventors: Jeffrey S. Brown, Middlesex, VT (US); Bryant C. Colwill, Poughkeepsie, NY (US); Terence B. Hook, Jericho, VT (US); Dennis Hoyniak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/421,969

(22) Filed: Apr. 23, 2003

(65) Prior Publication Data

US 2003/0211715 A1 Nov. 13, 2003

Related U.S. Application Data

(62) Division of application No. 10/083,062, filed on Feb. 26, 2002, now Pat. No. 6,610,585.

(51) Int. Cl.⁷ .......................................... H01L 21/265
(52) U.S. Cl. ..................................... 438/510; 438/527
(58) Field of Search ................... 438/510–530, 438/218–233, 299, 301

(56) References Cited

U.S. PATENT DOCUMENTS

| | | | |
|---|---|---|---|
| 4,913,929 A | | 4/1990 | Moslehi et al. |
| 5,041,362 A | | 8/1991 | Douglas |
| 5,310,626 A | | 5/1994 | Fernandes et al. |
| 5,393,679 A | * | 2/1995 | Yang |
| 5,422,301 A | * | 6/1995 | Otsuki .................. 438/217 |
| 5,770,350 A | | 6/1998 | Lee |
| 5,814,866 A | * | 9/1998 | Borland |
| 5,827,763 A | | 10/1998 | Gardner et al. |
| 5,966,599 A | * | 10/1999 | Walker et al. |
| 5,981,327 A | * | 11/1999 | Kim ..................... 438/228 |
| 5,985,519 A | | 11/1999 | Kakamu et al. |
| 6,117,618 A | | 9/2000 | Yedur et al. |
| 6,117,619 A | | 9/2000 | Forbes et al. |
| 6,121,624 A | | 9/2000 | Stevie et al. |
| 6,162,584 A | | 12/2000 | Chen et al. |
| 6,225,234 B1 | | 5/2001 | Miller et al. |
| 6,255,036 B1 | | 7/2001 | Tanaka et al. |
| 6,587,376 B2 | * | 7/2003 | Mihnea |
| 2002/0042184 A1 | * | 4/2002 | Nandakumar et al. ...... 438/393 |
| 2003/0197227 A1 | * | 10/2003 | Breitwisch et al ......... 257/369 |

OTHER PUBLICATIONS

Kanbe et al, "a 7 Mask CMOS Technology Utilyzing Liquid Phase Selective Oxidation Process" 638–IEDM 91(IEEE).*

* cited by examiner

*Primary Examiner*—Savitri Mulpuri
(74) *Attorney, Agent, or Firm*—Schmeiser, Olsen & Watts; William D. Sabo

(57) ABSTRACT

A method of ion implantation is provided. The method comprising: providing a substrate; forming a masking image having a sidewall on the substrate; forming a blocking layer on the substrate and on the masking image; and performing a retrograde ion implant through the blocking layer into the substrate, wherein the blocking layer substantially blocks ions scattered at the sidewall of the masking layer.

9 Claims, 9 Drawing Sheets

METHOD FOR FORMING A RETROGRADE IMPLANT

This application is a divisional of Ser. No. 10/083,062; filed on Feb. 26, 2002 now U.S. Pat. No. 6,610,585.

FIELD OF THE INVENTION

The present invention relates to the field of semiconductor processing; more specifically, it relates to a method for forming a retrograde ion implant.

BACKGROUND OF THE INVENTION

Modern semiconductor devices such as N channel field effect transistors (NFETs) and P-channel field effect transistors (PFETs) require careful tailoring of the dopant concentration profile in the channel region of the device in order to control voltage ($V_T$), off currents ($I_{OFF}$) and short channel effects (SCE). For an NFET, the channel is formed by control of the P-well dopant profile concentration. For a PFET, the channel is formed by control of the N-well dopant profile concentration. Control of the respective N or P-well profile is accomplished by performing at least one low-voltage and low-dose shallow ion implant and at least one high-voltage and high-dose ion retrograde implant, both of the same dopant type. A shallow implant is one in which the implanted species remain relatively close to the silicon surface. A retrograde implant is one in which the highest dopant concentration of the implanted species occurs a distance below the silicon surface. The channel/well profile tailoring ion implant processes may be best understood by reference to FIGS. 1A and 1B.

FIGS. 1A and 1B are partial cross-sectional views illustrating a related art method of forming a P-well or an N-well. In FIG. 1A, formed in a substrate 100 is shallow trench isolation (STI) 105. Formed on a top surface 110 of silicon substrate 100 is a thin oxide layer 115. Formed on a top surface 120 of STI 105 is a photoresist image 125. A low-voltage and low-dose ion implantation of ion species "X," where "X" represents boron for a P-well or phosphorus for an N-well, is performed. Ions 130A pass through thin oxide layer 115 and penetrate into substrate 100 forming a shallow portion 135 of well 140. Ions 130B striking photoresist image 125 are absorbed by photoresist image 125. Ions 130C, striking near sidewall 145 of photoresist image 125 are deflected by atoms in the photoresist but image lack sufficient energy to pass through the sidewall of the photoresist image.

In FIG. 1B, a high-voltage and high-dose ion implantation of ion species "X," where "X" represents boron or for a P-well or phosphorus for an N-well, is performed. Ions 150A pass through thin oxide layer 115 and penetrate into substrate 100 forming a deep portion 155 of well 135. Ions 150B striking photoresist image 125 are absorbed by the photoresist image. Ions 150C, striking near sidewall 145 of photoresist image 125 penetrate into the photoresist image, are deflected by atoms in photoresist image 125, and have sufficient energy to escape through sidewall 145, pass through thin oxide layer 115 and penetrate into an edge region 160 of well 140. Edge region 160 extends a distance "W" into well 140 measured from resist sidewall 145. Edge region 160 extends a depth "D" measured from a top surface 165 of thin oxide layer 115. Obviously P-wells or N-wells away from photoresist image 125 are not effected and do not have edge regions, "D" can range from about near zero to 0.5 microns and "W" can range from about near zero to 1.2 microns. The $V_T$ of NFETs and PFETs devices fabricated in wells adjacent to photoresist image 125 can differ from the $V_T$ of NFETs and PFETs fabricated in wells away from (non-adjacent) by as much as about 20 to 120 millivolts. The concentration of dopant in the shallow portion 135 of well 140 in edge region 160 can be ten times the concentration of dopant in the rest of shallow portion 135 of well 140.

Since devices fabricated away from edge region 160 or in wells away from a resist sidewall, which will not have an edge region, their $V_T$ will not be increased. Integrated circuits fabricated from a mix of edge and non-edge NFETs and PFETs will have some slow devices and some fast devices. Integrated circuits fabricated from a mix of edge and non-edge NFETs and PFETs and will often exhibit asymmetric behavior.

Therefore, what is needed is a method of forming retrograde ion implants that dose not cause increased dopant concentrations in edge regions of P-wells and N-wells.

SUMMARY OF THE INVENTION

A first aspect of the present invention is a method of ion implantation comprising: providing a substrate; forming a masking image having a sidewall on the substrate; forming a blocking layer on the substrate and on the masking image; and performing a retrograde ion implant through the blocking layer into the substrate, wherein the blocking layer substantially blocks ions scattered at the sidewall of the masking layer.

A second aspect of the present invention is a method of ion implantation comprising: providing a substrate; forming blocking layer on the substrate; forming a masking image having a sidewall on the blocking layer; and performing a retrograde ion implant through the blocking layer into the substrate, wherein the blocking layer substantially blocks ions scattered at the sidewall of the masking layer.

A third aspect of the present invention is a method of ion implantation comprising: providing a substrate; forming a first blocking layer on the substrate and a second blocking layer on the first blocking layer; forming a masking image having a sidewall on the second blocking layer; and performing a retrograde ion implant through the first and second blocking layer into the substrate, wherein the second or first and second blocking layers substantially blocks ions scattered at the sidewall of the masking layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A low-voltage ion implant generally results in a shallow ion implant. Shallow implants are often performed at low dose as well as low voltage. In a shallow ion implant, the implanted species remain relatively close to the substrate surface and the highest dopant concentration of the implanted species occurs at or very near the substrate surface. In this disclosure ion implants performed at a voltage of less than about 100 Kev and at a dose of less than about 5E13 atoms/cm$^2$ are considered shallow ion implants.

A high-voltage ion implant generally results in a retrograde ion implant provided any blocking layer is sufficiently thin. Retrograde ion implants are often performed at high-dose as well as high voltage. In a retrograde ion implant the highest dopant concentration of the implanted species occurs a distance below the substrate surface. In this disclosure ion implants performed at a voltage of equal to or greater than about 100 Kev and at a dose of about equal to or greater than 5E13 atoms/cm$^2$. The present invention is also applicable to shallow ion implants of low-energy and high-dose as well as to retrograde implants of high-energy and low-dose though the dopant concentration of the shallow portion of a P-well or an N-well formed by a shallow high-dose ion implant well would not be effected as much by scattering from a retrograde low-dose ion implant.

It has been determined that the amount of ion scattering of high-voltage and high-dose ion implants of boron and phosphorus is about the same for ion incident angles in the range of about 0° to 10° and increase significantly above about 10° with boron scattering more than phosphorus.

The ion implantation steps, both low-energy and low dose and high-energy and high-dose for all embodiments of the present invention, are performed at an incident angle between about 0° to 10° with 7° being most commonly used, though the invention is applicable to any angle between 0° and 90°. The incident angle is measured from a line normal to the surface being implanted.

While the present invention will be described in terms of a retrograde boron or phosphorus implant to form either a P-well or an N-well respectively, the invention is equally applicable to a retrograde implant of other ion species containing atoms of arsenic, germanium or indium used alone or in combination with each other and in combination with boron and/or phosphorus. Also one skilled in the art would realize that ion species containing boron or phosphorus could be implanted, for example, $BF_2^+$, and that the terms boron and phosphorus are intended to include all ion species containing boron or phosphorus.

The present invention is also applicable to other substrates such as sapphire, ruby, SiGe and silicon-on-insulator (SOI).

FIRST EMBODIMENT

Figure 1A:
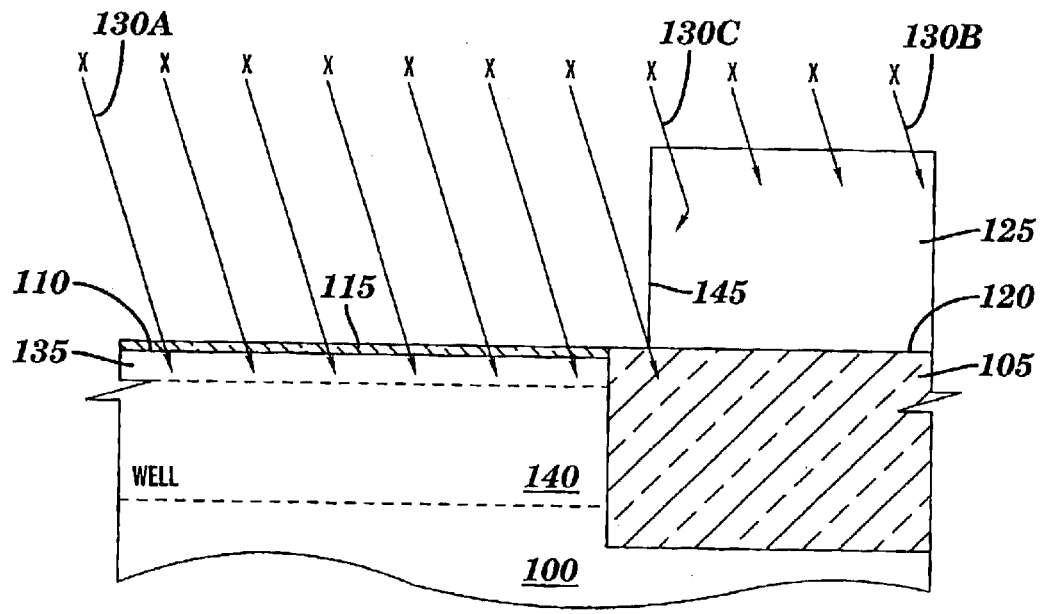
FIGS. 1A and 1B are partial cross-sectional views illustrating a related art method for forming a P-well or an N-well.
Figure 1B:
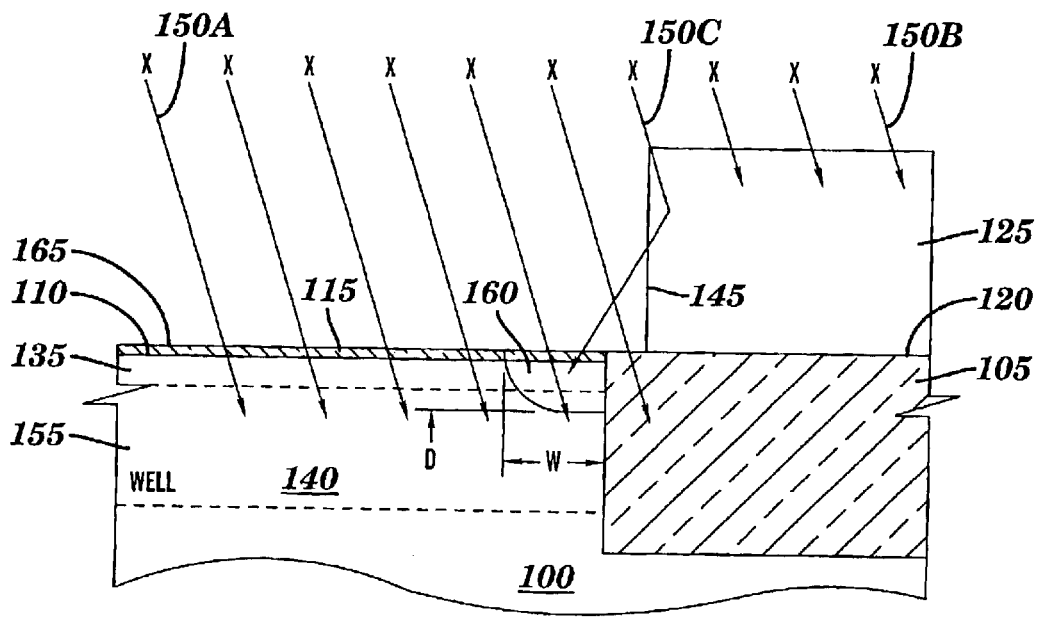
Figure 2:
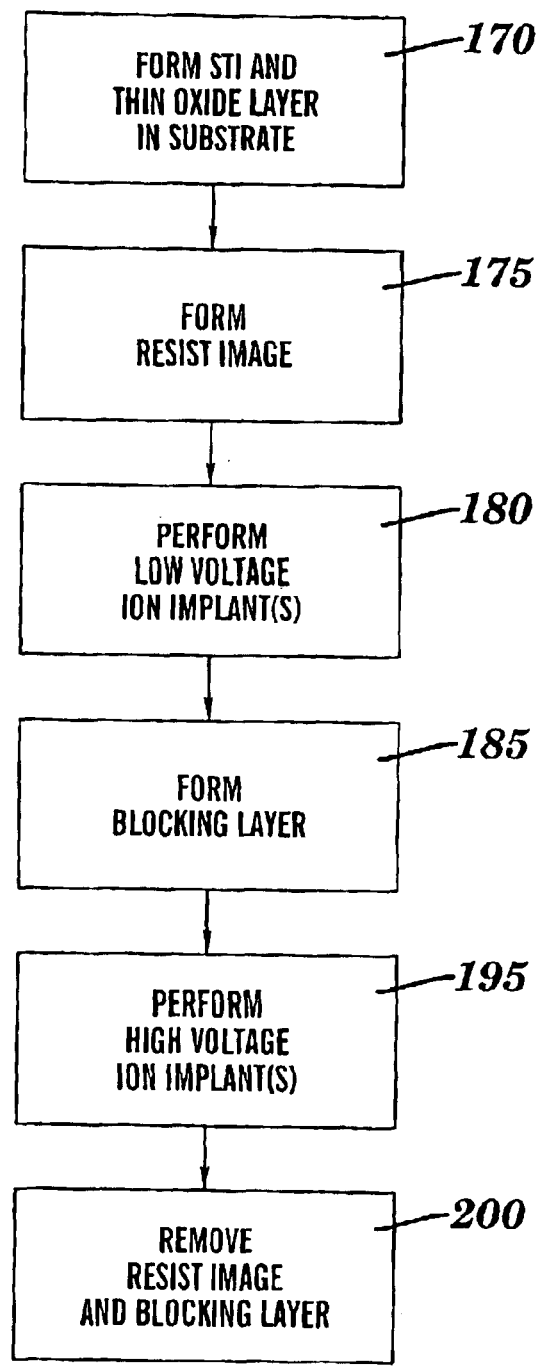
FIG. 2 is a flowchart of processing steps for forming a P-well or an N-well according to a first embodiment of the present invention.
Figure 3A:
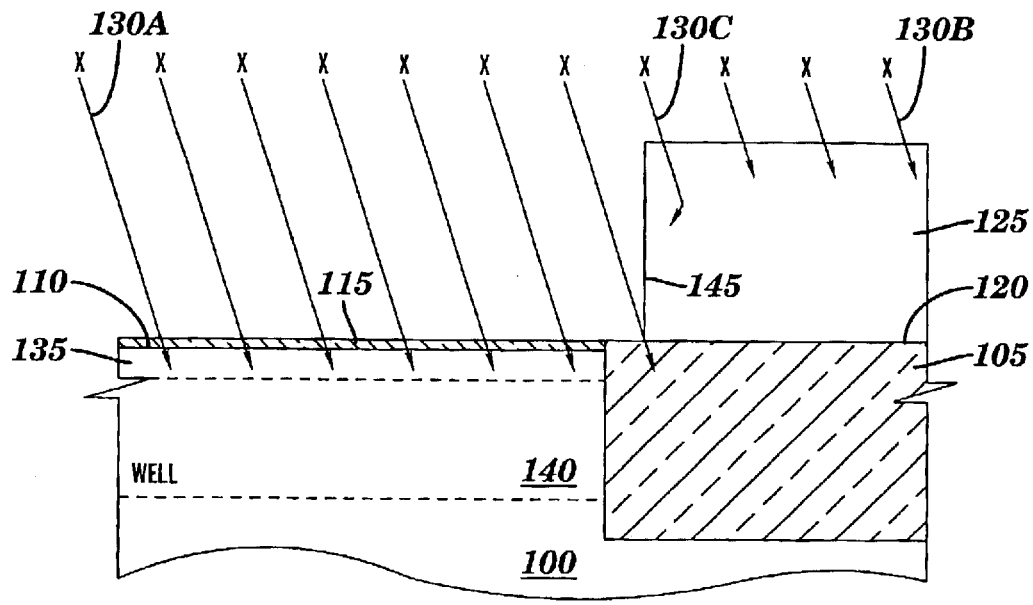
FIGS. 3A and 3B are partial cross-sectional views illustrating the ion implant steps of FIG. 2.
Figure 3B:
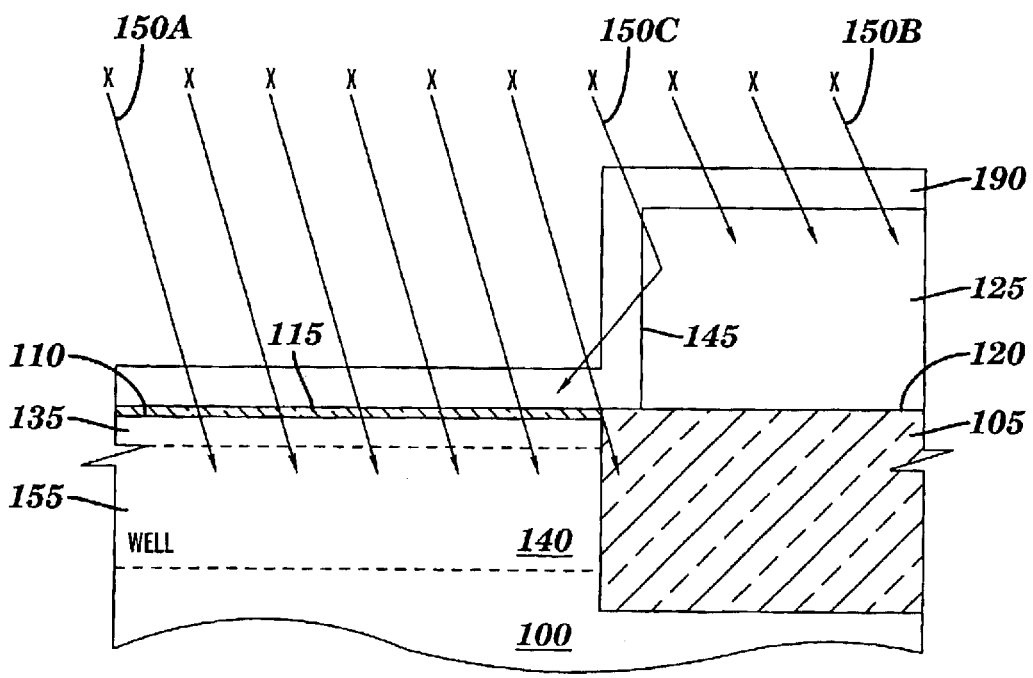

Referring to FIGS. 2, 3A and 3B, FIG. 2 is a flowchart of processing steps for forming a P-well or an N-well according to a first embodiment of the present invention and FIGS. 3A and 3B are partial cross-sectional views illustrating the ion implant steps of FIG. 2. Referring to FIG, 3A, in step 170 of FIG. 2, STI 105 is formed in substrate 100 and thin oxide layer 115 formed on top surface 110 of the silicon substrate. Depending upon the technology, thin oxide layer 115 may be explicitly formed or may be formed as a result of the shallow trench isolation (STI) processes previously performed. In one example, thin oxide layer 115 is about 40 to 60 Å thick. Both STI 105 and thin oxide layer 115 are optional.

Referring to FIG. 3A, in step 175 of FIG. 2, photoresist image 125 is formed on top surface 120 of STI 105 by any one of a number of photolithographic methods known to one skilled in the art. While the example of a photoresist image is used, other masking images formed from masking layers comprised of materials other than photoresist may be employed in this and subsequent embodiments of the present invention. In one example, photoresist image 125 is either positive or negative photoresist and is about 0.8 to 2.2 microns thick.

Referring to FIG. 3A, in step 180 of FIG. 2, a low-voltage and low-dose ion implantation of ion species "X," where "X" represents boron or for a P-well or phosphorus for an N-well, is performed. Ions 130A, striking thin oxide layer 115 pass through the thin oxide layer and penetrate into substrate 100 forming shallow portion 135 of well 140. Ions 130B striking photoresist image 125 are absorbed by the photoresist image. Ions 130C, striking photoresist image 125 near sidewall 145 of the photoresist image pass into the photoresist image and are deflected by atoms in the photoresist image. Ions 130C lack sufficient energy to escape through sidewall 145 of photoresist image 125 or if they do escape, to pass through thin oxide layer 115.

Referring to FIG. 3B, in step 185 of FIG. 2, a blocking layer 190 is formed over thin oxide layer 115 and photoresist image 125. It is not necessary that blocking layer cover sidewall 145 of photoresist image 125. Of course, when blocking layer 190 covers sidewall 145, the possibility exists for scattering of ions off the blocking layer itself, so the thickness of the blocking layer needs to take this into account as well.

Referring to FIG. 3B, in step 195 of FIG. 2, a high-voltage and high-dose ion implantation of ion species "X," where "X" represents boron or for a P-well or phosphorus for an N-well, is performed. Ions 150A striking blocking layer 190 pass through the blocking layer and through thin oxide layer 115 and penetrate into substrate 100 forming deep portion 155 of well 140. Ions 150B striking blocking layer 190, pass through the blocking layer, penetrate into photoresist image 125 and are absorbed by the photoresist image. Ions 150C striking blocking layer 190 near sidewall 145 of photoresist image 125 pass through the blocking layer, penetrate into the photoresist image and are deflected by atoms in the photoresist image. Ions 150C have sufficient energy to pass through sidewall 145 of photoresist image 125 but not through blocking layer 190 and are absorbed by the blocking layer.

A blocking layer substantially blocks ions scattered at the sidewall of a masking image from penetrating into the substrate by absorbing a significant portion of the scattered ions alone or in combination with overlaying or underlaying layers. Substantial blocking may be determined to have occurred when little or no difference in the $V_T$ of edge devices and the $V_T$ of non-edge devices can be measured or when the difference in edge device $V_T$ and non-edge device $V_T$ is within a preset limit. Alternatively, substantial blocking may be determined to have occurred when under similar processing conditions except for the presence or absence of a blocking layer, the $V_T$ of edge devices fabricated without the use of a blocking layer is measurably different (or different within a preset limit) from the $V_T$ of edge devices fabricated with the use of a blocking layer. Secondary ion mass spectroscopy (SIMS) analysis may also be used by comparing structures implanted away from resist edges with structures implanted near or next to resist edges.

That a given layer will exhibit substantial blocking can also be predicted by combining a theoretical determination of the amount of energy remaining to deflected ions with data from range tables or calculations using range equations of the material and thickness of the blocking layer such that a predetermine percentage of the total number of deflected ions do not penetrate into the substrate.

Blocking layer 190 must be thin enough to allow ions 150A to pass through but thick enough to block ions 150C from passing through, ions 150C having lost energy by collisions with atoms within photoresist image 125. In one example, blocking layer 190 is formed from any one of several organic anti-reflective coating (ARC) materials or other conformal materials well known in the art and is about 900 to 3600 Å thick.

Referring to FIG. 3B, in step 200 of FIG, 2, resist image 125 and blocking layer 190 are removed.

SECOND EMBODIMENT

Figure 4:
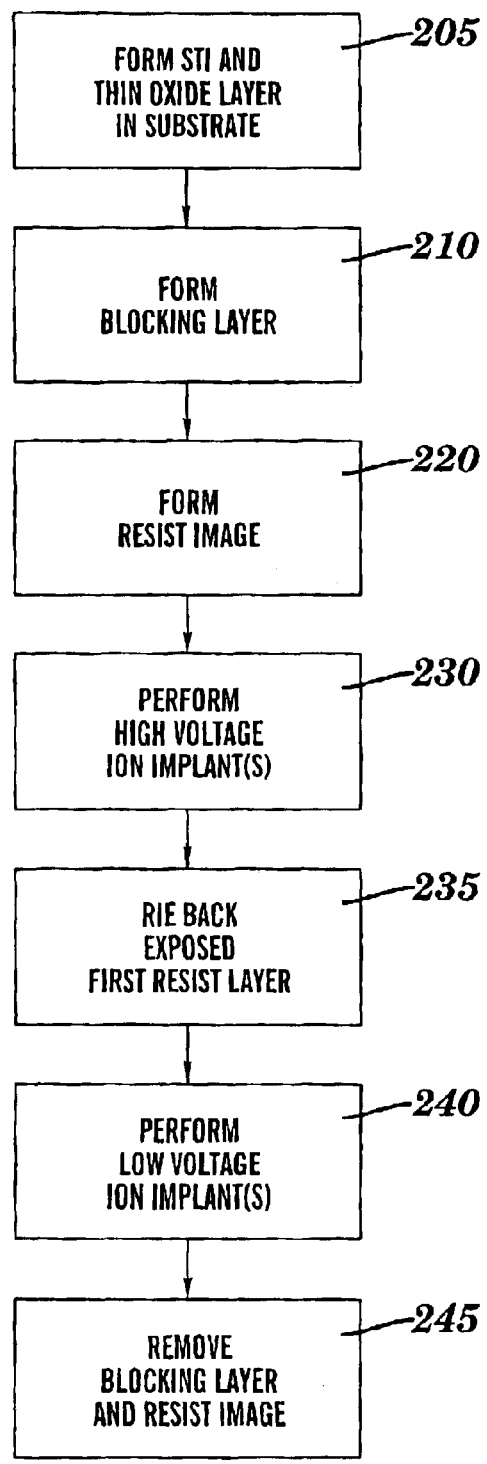
FIG. 4 is a flowchart of processing steps for forming a P-well or an N-well according to a second embodiment of the present invention.
Figure 5A:
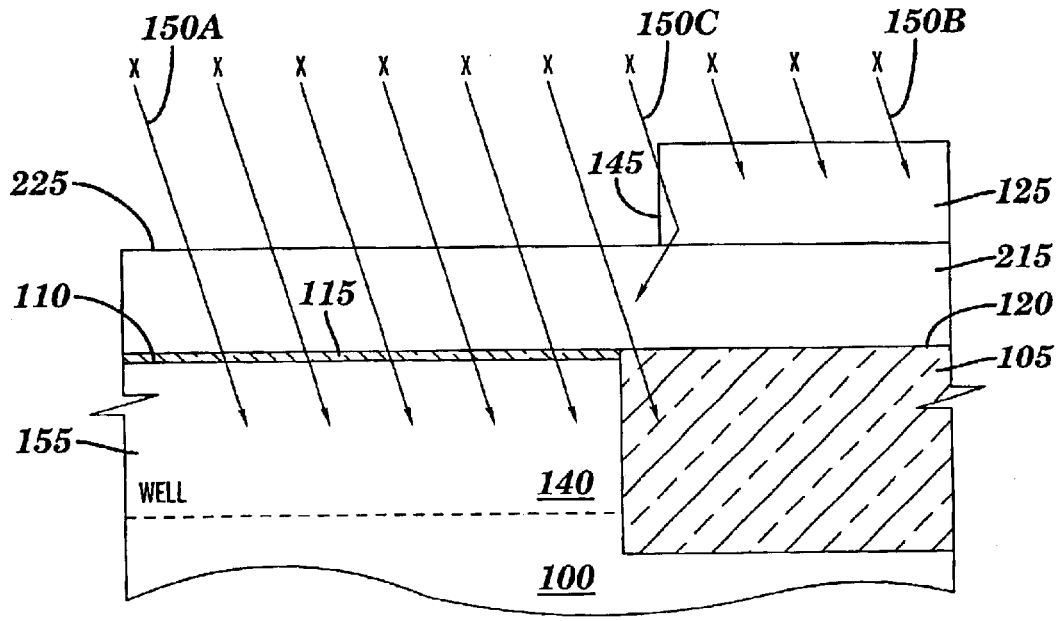
FIGS. 5A and 5B are partial cross-sectional views illustrating the ion implant steps of FIG. 4.
Figure 5B:
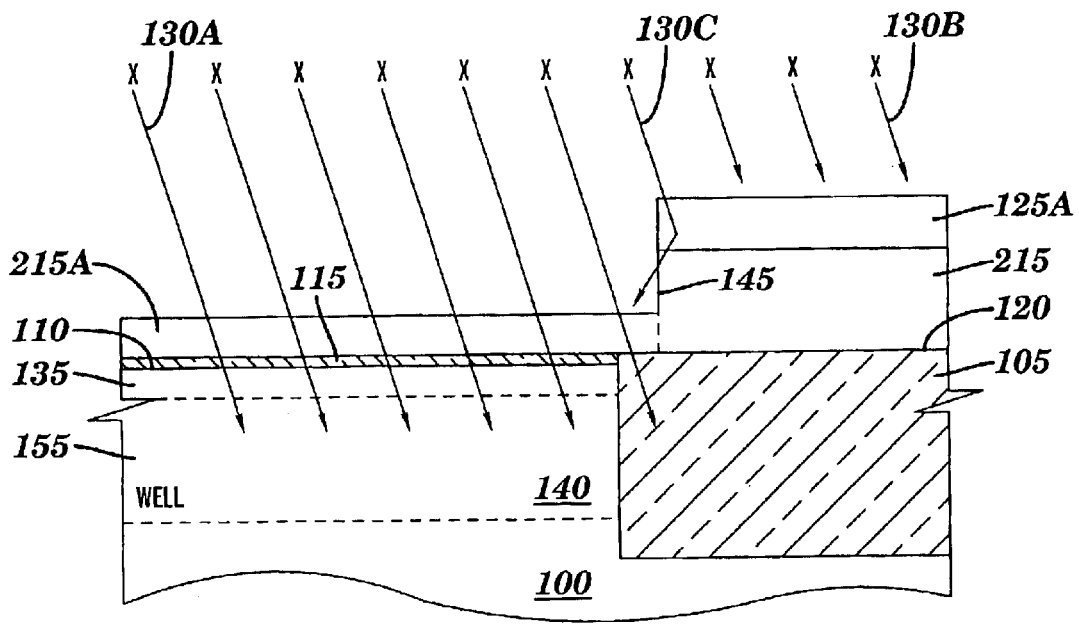

Referring to FIGS. 4, 5A and 5B, FIG. 4 is a flowchart of processing steps for forming a P-well or an N-well according to a second embodiment of the present invention and FIGS. 5A and 5B are partial cross-sectional views illustrating the ion implant steps of FIG. 4. Referring to FIG, 5A, in step 205 of FIG. 4, STI 105 is formed in substrate 100 and thin oxide layer 115 formed on top surface 110 of the silicon substrate. In one example, thin oxide layer 115 is about 40 to 60 Å thick. Both STI 105 and thin oxide layer 115 are optional.

Referring to FIG. 5A, in step 210 of FIG. 4, a blocking layer 215 is formed over thin oxide layer 115 and STI 105. In one example, blocking layer 215 is an organic material such as polyimide or photoresist and is about 1000 to 3000 Å thick.

Referring to FIG. 5A, in step 220 of FIG. 4, photoresist image 125 is formed on a top surface 225 of blocking layer 215. Photoresist image 125 is aligned over STI 105. Photoresist image 125 may be formed by any one of a number of photolithographic methods known to one skilled in the art. In one example, photoresist image 125 is either positive or negative photoresist and is about 0.8 to 2.0 microns thick.

If blocking layer 215 is formed from a photoresist material then photoresist image 125 is formed from a photoresist of opposite polarity from that of the blocking layer. For example, if blocking layer 215 is formed from positive resist, then photoresist image 125 is formed from negative resist. If blocking layer 215 is formed from negative resist, then photoresist image 125 is formed from positive resist.

Referring to FIG. 5A, in step 230 of FIG. 4, a high-voltage and high-dose ion implantation of ion species "X," where "X" represents boron or for a P-well or phosphorus for an N-well, is performed. Ions 150A striking blocking layer 215 pass through the blocking layer, through thin oxide layer 115 and penetrate into substrate 100 forming deep portion 155 of well 135. Ions 150B striking blocking layer 215, pass through the blocking layer, penetrate into photoresist image 125 and are absorbed by the photoresist image. Ions 150C, striking blocking layer 215 near sidewall 145 of photoresist image 125 pass through blocking the layer, are deflected by atoms in the photoresist image and have sufficient energy to pass through sidewall 145 of the photoresist image but not through the blocking layer and are absorbed by the blocking layer.

Blocking layer 215 must be thin enough to allow ions 150A to pass through but thick enough to block ions 150C from passing through, ions 150C having lost energy by collisions with atoms within photoresist image 125.

Referring to FIG. 5B, in step 235 of FIG. 4, blocking layer 215 (see FIG. 5A) is thinned to form a thinned portion 215A of blocking layer 215 where the blocking layer is not protected by photoresist image 125. In one example, thinned portion 215A of blocking layer 215 is about 0 to 1000 Å thick and the thinning was accomplished by any one of well known reactive ion etch (RIE) processes. Photoresist image 125 (see FIG. 5A) is also thinned by the RIE process to form thinned photoresist image 125A, so it is the combination of the thickness of thinned portion 215A of blocking layer 215 and the thickness of thinned photoresist image 215A that must be sufficient to block low voltage ion 130A.

Referring to FIG. 5B, in step 240 of FIG. 4, a low-voltage and low-dose ion implantation of ion species "X," where "X" represents boron or for a P-well or phosphorus for an N-well, is performed. Ions 130A, striking thinned blocking layer 215A pass through the thinned blocking layer, pass through thin oxide layer 115 and penetrate into substrate 100 forming shallow portion 135 of well 140. Ions 130B striking photoresist image 125 are absorbed by the photoresist image. Ions 130C, striking photoresist image 125 near sidewall 145 of the photoresist image are deflected by atoms in the photoresist image but lack sufficient energy to escape the photoresist image or if they do escape, to penetrate thinned portion 215A of blocking layer 215.

Referring to FIG. 5B, in step 245 of FIG. 4, resist image 125 thinned portion 215A and blocking layer 215 are removed.

THIRD EMBODIMENT

Figure 6:
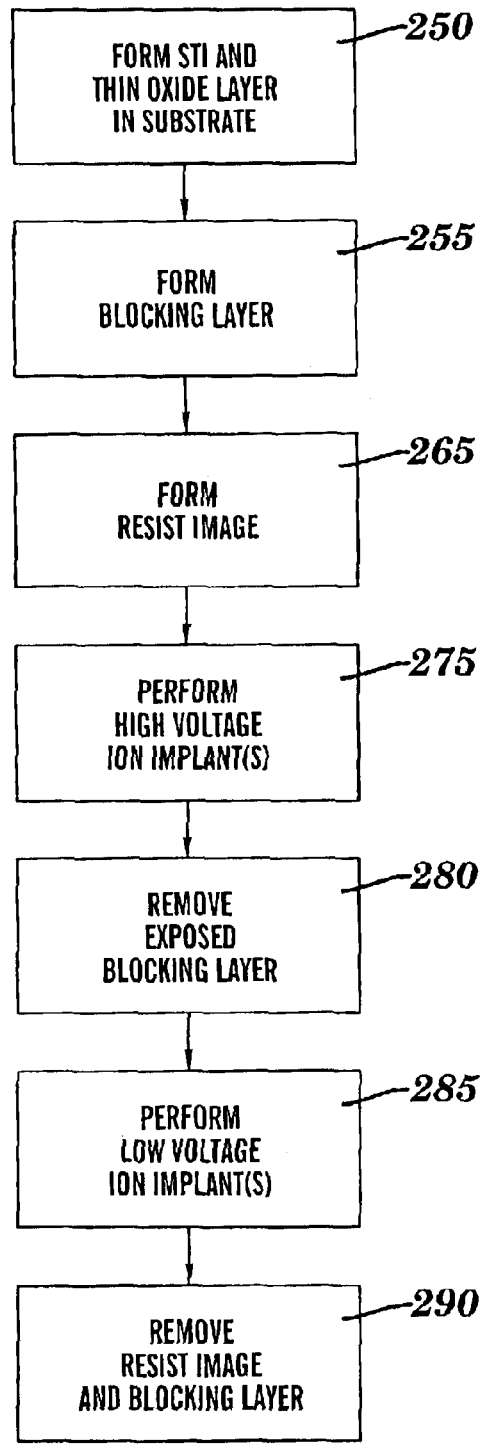
FIG. 6 is a flowchart of processing steps for forming a P-well or an N-well according to a third embodiment of the present invention.
Figure 7A:
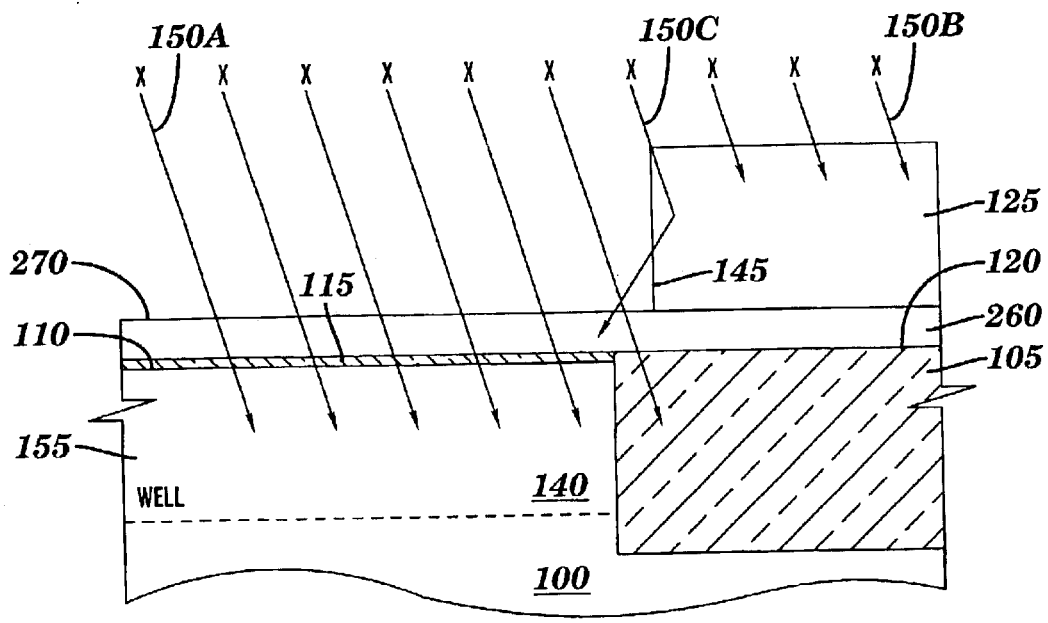
FIGS. 7A and 7B are partial cross-sectional views illustrating the ion implant steps of FIG. 6.
Figure 7B:
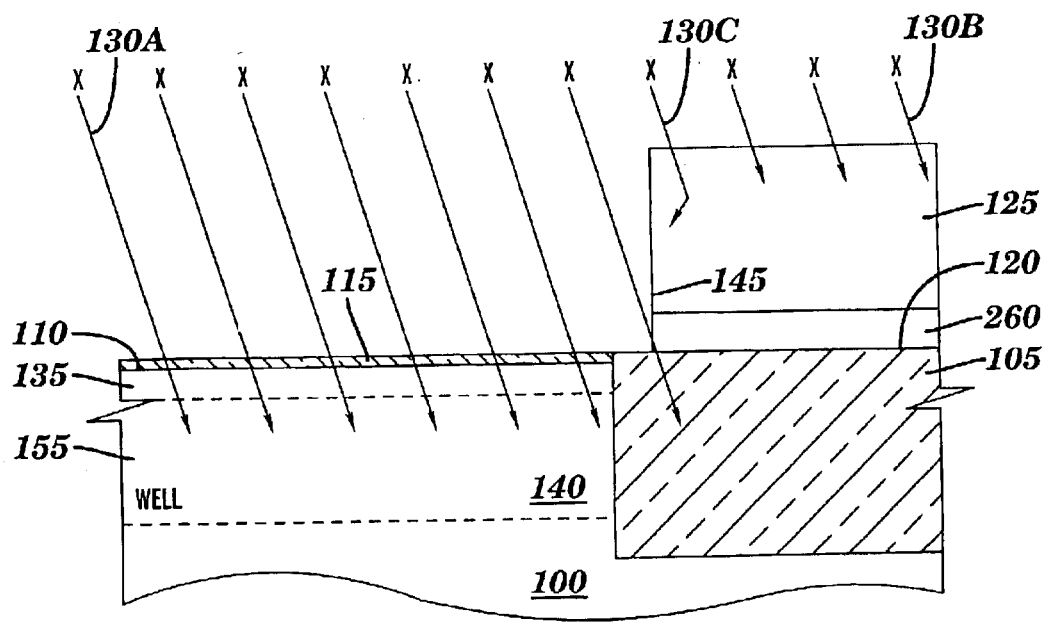

Referring to FIGS. 6, 7A and 7B, FIG. 6 is a flowchart of processing steps for forming a P-well or an N-well according to a third embodiment of the present invention and FIGS. 7A and 7B are partial cross-sectional views illustrating the ion implant steps of FIG. 6. Referring to FIG, 7A, in step 250 of FIG. 6, STI 105 is formed in substrate 100 and thin oxide layer 115 formed on top surface 110 of the silicon substrate. In one example, thin oxide layer 115 is about 40 to 60 Å thick. Both STI 105 and thin oxide layer 115 are optional.

Referring to FIG. 7A, in step 255 of FIG. 6, a blocking layer 260 is formed over thin oxide layer 115 and STI 105. In one example, blocking layer 260 is formed from silicon oxide, silicon nitride, polysilicon, borosilicate glass (BSG), boro-phosphorus-silicate glass (BPSG), quartz, tetraethoxysilane (TEOS) oxide or high density plasma (HDP) oxide and is about 200 to 3600 Å thick.

Referring to FIG. 7A, in step 265 of FIG. 6, photoresist image 125 is formed on a top surface 270 of blocking layer 260. Photoresist image is 125 is aligned over STI 105. Photoresist image 125 may be formed by any one of a number of photolithographic methods known to one skilled in the art. In one example, photoresist image 125 is either positive or negative photoresist and is about 1.2 to 2.2 microns thick.

Referring to FIG. 7A, in step 275 of FIG. 6, a high-voltage and high-dose ion implantation of ion species "X," where "X" represents boron or for a P-well or phosphorus for an N-well, is performed. Ions 150A striking blocking layer 260 pass through the blocking layer and through thin oxide layer 115 and penetrate into substrate 100 forming deep portion 155 of well 140. Ions 150B striking resist image 125, penetrate into the photoresist image and are absorbed by the photoresist image. Ions 150C, striking photoresist image 125 near sidewall 145 of the photoresist image penetrate into the photoresist image, are deflected by atoms in the photoresist image and have sufficient energy to pass through sidewall 145 of the photoresist image. Ions 150C do not have sufficient energy to pass through blocking layer 260 and are absorbed by the blocking layer.

Blocking layer 260 must be thin enough to allow ions 150A to pass through but thick enough to block ions 150C from passing through, ions 150C having lost energy by collisions with atoms within photoresist image 125.

Referring to FIG. 7B, in step 280 of FIG. 6, portions of blocking layer 260 not protected by resist image 125 are removed.

Referring to FIG. 7B, in step 2985 of FIG. 6, a low-voltage and low-dose ion implantation of ion species "X," where "X" represents boron or for a P-well or phosphorus for an N-well, is performed. Ions 130A, striking thin oxide layer 115 pass through the thin oxide layer and penetrate into substrate 100 forming shallow portion 135 of well 140. Ions 130B striking photoresist image 125 are absorbed by the photoresist image. Ions 130C, striking photoresist image 125 near sidewall 145 of the photoresist image are deflected by atoms in the photoresist image but lack sufficient energy to escape the photoresist image or if they do escape, to penetrate thin oxide layer 115.

Referring to FIG. 7B, in step 290 of FIG, 6, resist image 125 and blocking layer 260 are removed.

FOURTH EMBODIMENT

Figure 8:
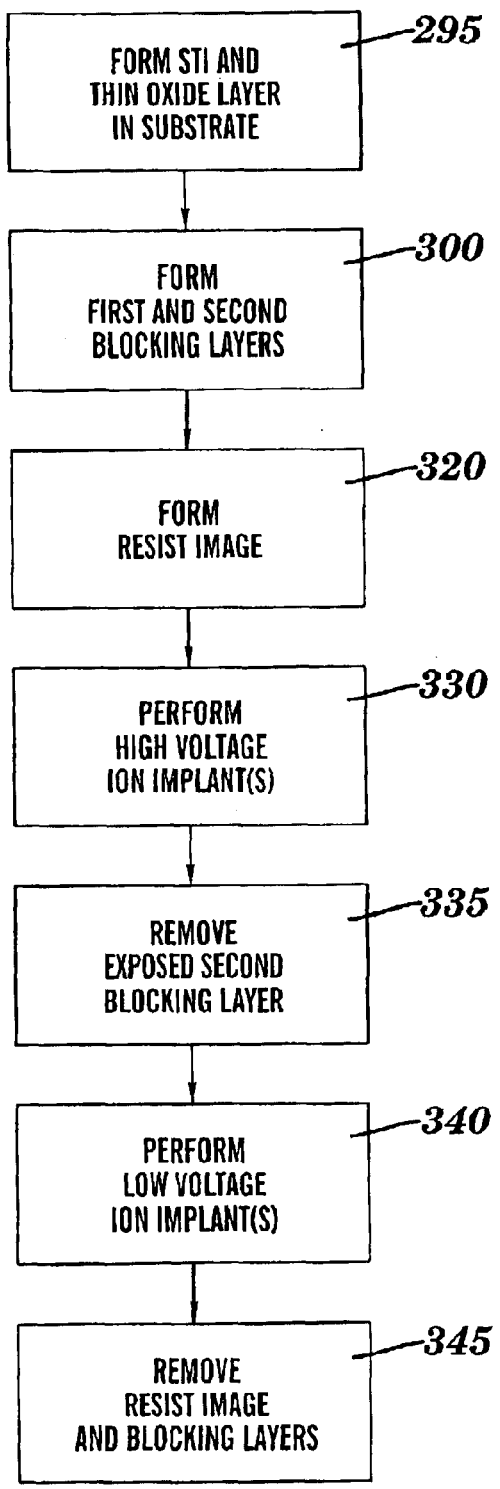
FIG. 8 is a flowchart of processing steps for forming a P-well or an N-well according to a fourth embodiment of the present invention.
Figure 9A:
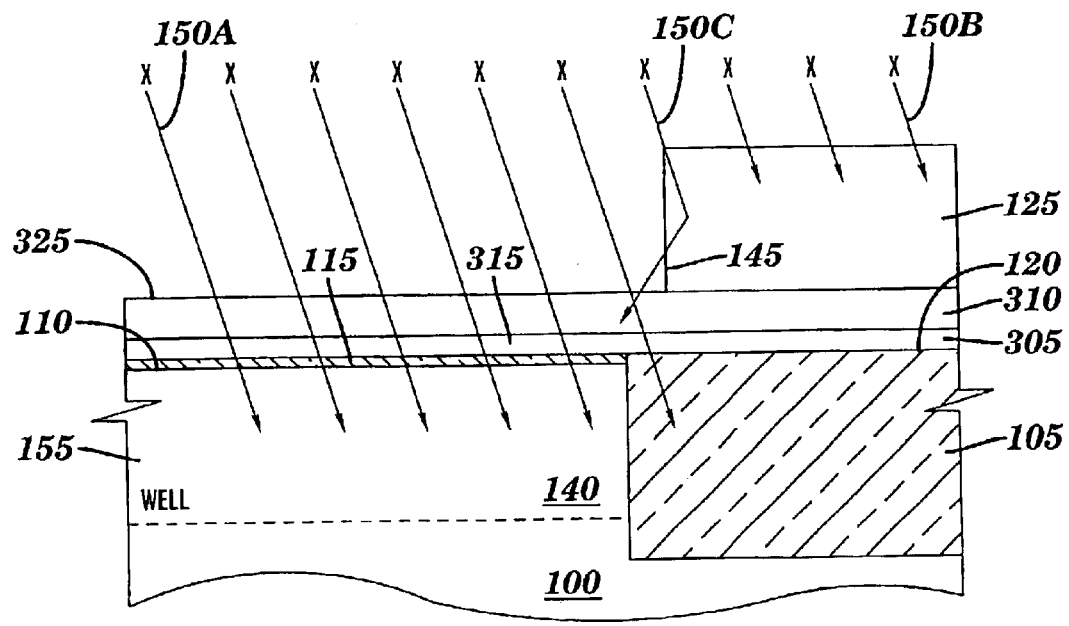
FIGS. 9A and 9B are partial cross-sectional views illustrating the ion implant steps of FIG. 7.
Figure 9B:
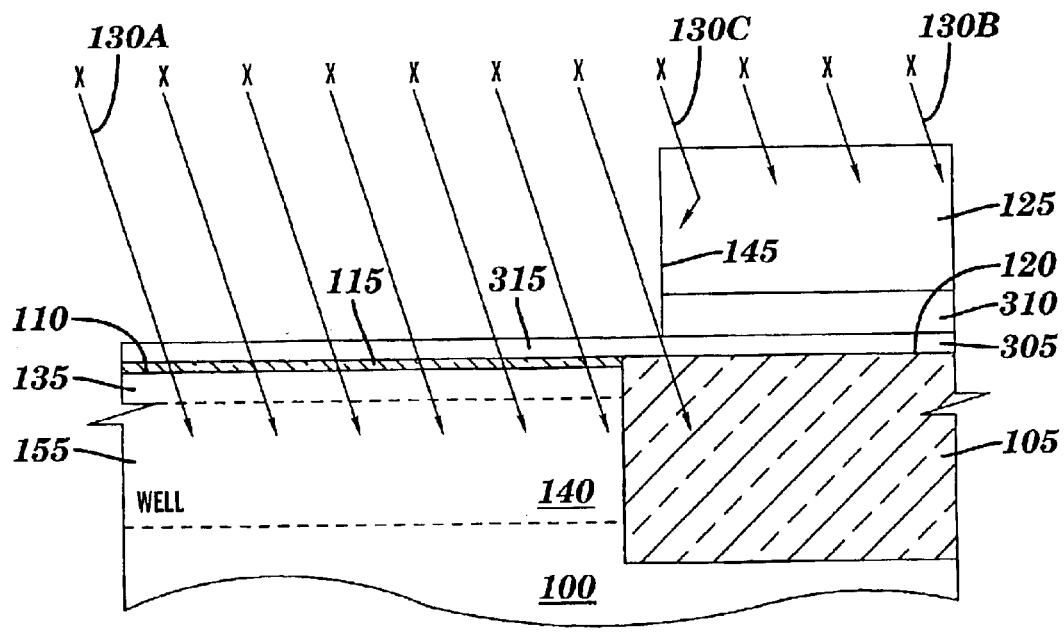

Referring to FIGS. 8, 9A and 9B, FIG. 8 is a flowchart of processing steps for forming a P-well or an N-well according to a fourth embodiment of the present invention and FIGS. 9A and 9B are partial cross-sectional views illustrating the ion implant steps of FIG. 7. Referring to FIG. 9A, in step 295 of FIG. 8, STI 105 is formed in substrate 100 and thin oxide layer 115 formed on top surface 110 of the silicon substrate. In one example, thin oxide layer 115 is about 40 to 60 Å thick. Both STI 105 and thin oxide layer 115 are optional.

Referring to FIG. 9A, in step 300 of FIG. 8, a first blocking layer 305 is formed over thin oxide layer 115 and STI 105 and a second blocking layer 310 is formed on top surface 315 of first blocking layer 305. In one example, first blocking layer 305 is formed from silicon nitride or polysilicon and is 100 to 500 Å thick and second blocking layer 310 is formed from borosilicate glass (BSG), borophosphorus-silicate glass (BPSG), quartz, tetraethoxysilane (TEOS) oxide, high density plasma (HDP) oxide or polysilicon and is about 500 to 2500 Å thick.

Referring to FIG. 9A, in step 320 of FIG. 8, photoresist image 125 is formed on a top surface 325 of second blocking layer 310. Photoresist image is 125 is aligned over STI 105. Photoresist image 125 may be formed by any one of a number of photolithographic methods known to one skilled in the art. In one example, photoresist image 125 is either positive or negative photoresist and is about 1.2 to 2.2 microns thick.

Referring to FIG. 9A, in step 330 of FIG. 8, a high-voltage and high-dose ion implantation of ion species "X," where "X" represents boron or for a P-well or phosphorus for an N-well, is performed. Ions 150A striking second blocking layer 310 pass through second blocking layer, pass through first blocking layer 305, pass through thin oxide layer 115 and penetrate into substrate 100 forming deep portion 155 of well 140. Ions 150B striking resist image 125, penetrate into the photoresist image and are absorbed by the photoresist image. Ions 150C, striking photoresist image 125 near sidewall 145 of the photoresist image penetrate into the photoresist image, are deflected by atoms in the photoresist image, have sufficient energy to pass through sidewall 145 of the photoresist image but not through second blocking layer 310 or first and second blocking layer 305 and 310 and are absorbed by the blocking layer(s).

First and second blocking layers 305 and 310 must be thin enough to allow ions 150A to pass through but thick enough to block ions 150C from passing through, ions 150C having lost energy by collisions with atoms within photoresist image 125.

Referring to FIG. 9B, in step 335 of FIG. 8, portions of second blocking layer 340 not protected by resist image 125 are removed. First blocking layer 305 acts as an etch stop during the etching of second blocking layer 310.

Referring to FIG. 9B, in step 340 of FIG. 8, a low-voltage and low-dose ion implantation of ion species "X," where "X" represents boron or for a P-well or phosphorus for an N-well, is performed. Ions 130A, striking first blocking layer 305, pass through first blocking layer 305, pass through thin oxide layer 115 and penetrate into substrate 100 forming shallow portion 135 of well 140. Ions 130B striking photoresist image 125 are absorbed by the photoresist image. Ions 130C, striking photoresist image 125 near sidewall 145 of the photoresist image are deflected by atoms in the photoresist image but lack sufficient energy to escape the photoresist image or if they do escape, to penetrate first blocking layer 305.

Referring to FIG. 9B, in step 345 of FIG, 8, resist image 125, second blocking layer 310 and first blocking layer 305 are removed.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of ion implantation comprising: providing a substrate having a shallow trench isolation;

forming a first blocking layer on said substrate having a shallow trench isolation and a second blocking layer on said first blocking layer;

forming a masking image having a sidewall on said second blocking layer; and performing a retrograde ion implant into said masking image and through said first and second blocking layers into said substrate, said first and second blocking layers having a sufficient combined thickness to substantially block from entering said substrate ions scattered in said masking image from said retrograde ion implant and exiting said masking image through the sidewall of said masking image.

2. The method of claim 1, further comprising:

after said performing the retrograde ion implant, thinning or removing said second blocking layer where said second blocking layer is not covered by said masking image; and performing a shallow ion implant.

3. The method of claim 1, wherein said first and second blocking layers block a sufficient quantity of said ions of said retrograde ion implant so that a threshold voltage of a field effect transistor formed in said substrate immediately adjacent to said sidewall of said masking image about equal to a threshold voltage of a field effect transistor formed in said substrate away from said sidewall of said masking image.

4. The method of claim 1, wherein said performing the retrograde implant is performed using ion species containing atoms selected from the group consisting of boron, phosphorous, arsenic, germanium and indium.

5. The method of claim 1, wherein said performing the retrograde ion implant is performed at an energy of equal to or greater than 100 Kev.

6. The method of claim 1, further comprising:
performing a shallow ion implant after removing only said second blocking layer.

7. The method of claim 2, wherein said performing the shallow ion implant is performed using ion species containing atoms selected from the group consisting of boron, phosphorous, arsenic, germanium and indium.

8. The method of claim 2, wherein said performing the shallow ion implant is performed at an energy of less than 100 Kev and a dose of less than 5E13 atm/cm$^2$.

9. The method of claim 1, wherein said first blocking layer includes a first material selected from the group consisting of silicon nitride and polysilicon and, wherein said second blocking layer includes a second material selected from the group consisting of borosilicate glass, boro-phosphorus-silicate glass, quartz, tetraethoxysilane oxide, high density plasma oxide polysilicon and silicon nitride.

* * * * *